US006308295B1

(12) United States Patent
Sridharan et al.

(10) Patent No.: US 6,308,295 B1
(45) Date of Patent: *Oct. 23, 2001

(54) PARALLEL SPECTRAL REED-SOLOMON ENCODER AND DECODER

(75) Inventors: Satish Sridharan, Camarillo, CA (US); Mark A. Neifeld, Tucson, AZ (US)

(73) Assignee: Arizona Board of Regents, Tucson, AZ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/946,166

(22) Filed: Oct. 7, 1997

Related U.S. Application Data
(60) Provisional application No. 60/027,952, filed on Oct. 8, 1996.

(30) Foreign Application Priority Data

Apr. 10, 1997 (JP) .................................................. 9-002706
May 30, 1997 (JP) .................................................. 9-141394

(51) Int. Cl.$^7$ ....................................................... G06F 17/00
(52) U.S. Cl. ........................... 714/755; 707/101; 714/746; 714/759
(58) Field of Search ..................................... 375/200–315; 370/200–479; 371/30–72; 707/1–206; 714/781–785, 746–759

(56) References Cited

U.S. PATENT DOCUMENTS

| | | | |
|---|---|---|---|
| 4,077,028 | 2/1978 | Lui et al. ............................. | 340/146.1 |
| 4,099,160 | 7/1978 | Flagg ................................... | 340/146.1 |
| 4,142,174 | 2/1979 | Chen et al. .......................... | 340/146.1 |
| 4,162,480 | 7/1979 | Berlekamp ........................... | 340/146.1 |
| 4,336,612 | 6/1982 | Inoue et al. .............................. | 371/39 |
| 4,494,234 | 1/1985 | Patel ........................................ | 371/38 |
| 4,504,948 | 3/1985 | Patel ........................................ | 371/38 |
| 4,555,784 | 11/1985 | Wood ...................................... | 371/37 |
| 4,633,470 | 12/1986 | Welch et al. ........................... | 371/37 |

(List continued on next page.)

OTHER PUBLICATIONS

Mark A. Neifeld; Improvements in the Data Fidelity of Photorefractive Memories; Jul. 1995; The International Society for Optical Engineering, vol. 2529.

Mark A. Neifeld, et al.; Parallel Error Correction for Optical Memories; 1994; p. 87–98; Optical Memory and Neural Networks, vol. 3, No. 2.

Mark A. Neifeld, et al.; Optical and Electronics Error Correction Schemes for Highly Parallel Access Memories; Jul., 1993; pp. 543–553; The International Society for Optical Engineering, vol. 2026.

Chuck Benz, et al.; An Error–Correcting Encoder and Decoder for a 1 Gbit/s Fiber Optic Link; 1991; pp. 7.1.1–7.1.4; IEEE 1991 Custom Integrated Circuits Conference.

Somsak Choomchuay, et al.; An Algorithm and a VLSI Architecture for Reed Solomon Decoding: 1992; pp. 2120–2123; 1992 IEEE.

(List continued on next page.)

*Primary Examiner*—Thomas Black
*Assistant Examiner*—David Jung
(74) *Attorney, Agent, or Firm*—David L. Soltz (57) ABSTRACT

In the disclosed error correcting scheme, information data is encoded and decoded in parallel and in the spectral or frequency domains based on a Reed-Solomon (RS) code. As a result, when compared with space domain decoding, the spectral decoding scheme of the present invention shifts some of the computationally intensive modules into the encoder thus reducing decoder complexity. Thus, integrated circuit implementations of the error correcting scheme of the present invention are faster, have reduced power dissipation and occupy less chip area than serial encoders and decoders.

14 Claims, 10 Drawing Sheets

U.S. PATENT DOCUMENTS

| | | | |
|---|---|---|---|
| 4,667,326 | 5/1987 | Young et al. | 371/40 |
| 4,675,869 | 6/1987 | Driessen | 371/37 |
| 4,763,330 | 8/1988 | Shimizu | 371/37 |
| 4,763,332 | 8/1988 | Glover | 371/37 |
| 4,839,896 | 6/1989 | Glover et al. | 371/37 |
| 4,845,713 | 7/1989 | Zook | 371/37 |
| 4,937,829 | 6/1990 | Kadokawa | 371/37.6 |
| 5,040,179 | 8/1991 | Chen | 371/37.1 |
| 5,170,399 | 12/1992 | Cameron et al. | 371/37.1 |
| 5,226,043 | 7/1993 | Pughe, Jr. et al. | 371/40.1 |
| 5,272,661 | 12/1993 | Raghavan et al. | 364/746.1 |
| 5,285,451 | 2/1994 | Henson et al. | 371/11.1 |
| 5,307,377 * | 4/1994 | Chouly et al. | 371/37.11 |
| 5,384,786 | 1/1995 | Dudley et al. | 371/37.1 |
| 5,425,050 * | 6/1995 | Schreiber et al. | 380/10 |
| 5,491,772 * | 2/1996 | Hardwick et al. | 714/755 |
| 5,684,810 * | 11/1997 | Nakamura et al. | 714/755 |
| 5,719,884 | 2/1998 | Roth et al. | 371/37.4 |
| 5,754,563 | 5/1998 | White | 371/376 |
| 5,835,529 * | 11/1998 | Koga et al. | 370/344 |
| 6,141,787 * | 10/2000 | Kunisa et al. | 714/784 |
| 6,154,869 * | 11/2000 | Wolf | 714/785 |

OTHER PUBLICATIONS

B. Arambepola, et al.; VLSI Array Architecture for Reed–Solomon Decoding; Apr., 1991; pp. 2963–2966; 1991 IEEE; CH 3006–4.

Mark A. Niefeld, et al.; Error Correction for Increasing the Usable Capacity of Photorefractive Memories; 1994; pp. 1483–1485; Optics Letters, vol. 19, No. 18.

Mark A. Niefeld, et al; Error–correction Schemes for Volume Optical Memories; Dec. 10, 1995; pp. 8183–8191; Applied Optics; vol. 34, No. 35.

B. Arambepola, et al.; Algorithms and Architectures for Reed–Solomon Codes; 1992; pp. 172–184; GEC Journal of Research; vol. 9, No. 3.

Howard M. Shao, et al.; A VLSI Design of a Pipeline Reed–Solomon Decoder; May, 1985; pp. 393–403; Transactions on Computers; vol. C–34, No. 5.

Richard E. Blahut; A Universal Reed–Solomon Decoder; Mar., 1984; pp. 150–157; IBM J. Res. Develop.; vol. 28, No. 2.

D. M. Castagnozzi et al.; Error Correcting Coding of a 220Mbit/s Coherent Optical Communication Channel; Aug. 2, 1990; pp. 1288–1290; Electronics Letters; vol. 26, No. 16.

L. Welch et al., Continued Fractions and Berlekamp's Algorithm, IEEE Transactions on Information Theory, vol. IT–25, No. 1, Jan. 1979, pp. 19–27.

S. Choomchuay, et al.; Error Correction, Reed–Solomon Decoding, VLSI; Jun., 1993; pp. 189–196; IEE Proceedings–I; vol. 140, No. 3.

Shyue–Win Wei, et al.p; High–Speed Decoder of Reed–Solomon Codes; Nov., 1993; pp. 1588–1593; IEEE Transactions on Communications; vol. 41, No. 11.

William D. Doyle, et al.; A High Capacity, High Performance, Small Form Factor Magnetic Tape Storage System; Sep., 1990; pp. 2152–2156; IEEE Transactions on Magnetics; vol. 26, No. 5.

Christopher R. Hawthorne, et al.; An Error–Correction Scheme for a Helical–Scan Magnetic Data Storage System; Jan., 1992; pp. 267–275; IEEE Journal on Selected Areas in Communications; vol. 10, No. 1.

Toshinari Suematsu, et al.; An Error Position Recording Method for Optical Disks; 1993; pp. 3–43; Electronics and Communications in Japan; Part 3, vol. 76, No. 3.

Jiren Yuan, et al; 1.2 Gbit/s Error–correcting en/decoder for Optical Fibre Communication in 1.2 um CMOS; 1991; pp. 1901–1904; IEEE; CH 3006–4.

J. Franz, et al.; Error Correcting Coding in Optical Transmission Systems with Direct Detection and Heterodyne Receivers; 1993; pp. 194–199; Journal of Optical Communications, 14 (1993).

S.R. Whitaker, Reed Solomon VLSI Codec For Advanced Television, IEEE Transactions Circuits and Systems for Video Technology, vol. 1, No. 2, Jun. 1991, pp. 230–236.

Razavi S. H., et al.; Error Control Coding for Future Digital Cellular Systems; 1992; pp. 685–689; IEEE.

Toby D. Bennett, et al.; A Single–Chip Deinterleaving Red–Solomon Decoder for High Performance CCDS Telemetry; 1992; pp. 12–19—12–21; IEEE.

T. K. Truong, et al.; Simplified Procedure for Correcting Both Errors and Erasures of Reed–Solomon Code Using Euclidean Algorithm; Nov., 1988; pp. 318–324; IEE Proceedings; vol. 135, Pt. E, No. 6.

Kuang Y. Liu; Architecture for VLSI Design of Reed–Solomon Encoders; Feb., 1982; pp. 170–175; IEEE Transactions on Computers, vol. C–31, No. 2.

Tetsuo Iwaki, et al.; Architecture of a High Speed Reed–Solomon Decoder; Feb. 1994; pp. 75–82; IEEE Transactions on Consumer Electronics, vol. 40, No. 1, Feb. 1994.

Yong Hwan Kim, et al.; A VLSI Reed–Solomon Decoder; 1992; pp. 1064–1075; The International Society for Optical Engineering/Visual Communications and Image Processing '92; vol. 1818.

Pomeranz et al., "Vector replacement to improve static–test compaction for synchronous sequential circuits", Computer–Aided Design of Integrated Circuits and Systems, IEEE Transactions on, vol. 20, Issue 2, pp. 336–342, Feb. 2001.*

Ruan et al., "A bi–partitioni–codec architecture to reduce power in pipelined circuits", Computer–Aided Designh of Integrated Circuits and Systems, IEEE Transactions on, Vol. 2, Issue 2, pp. 343–348, Feb. 2001.*

Aziz et al., "Efficient control state–space search", Computer–Aided Design of Integrated Circuits and Systems, IEEE Transactions on, Vol. 20, Issue 2, pp. 332–336, Feb. 2001.*

Berlekamp, "Algebraic Coding Theory", Agean Park Press, pp. 177–199, Dec. 1984.*

* cited by examiner

PARALLEL SPECTRAL REED-SOLOMON ENCODER AND DECODER

This application claims priority of U.S. Provisional Application Ser. No. 60/027,952 filed Oct. 8, 1996.

The U.S. Government has a paid-up license in this invention and the right in limited circumstances to require the patent owner to license others on reasonable terms as provided for by the terms of contract nos. AFOSR F496209310477 and AASERT 496209410303 awarded by the United States Air Force.

BACKGROUND OF THE INVENTION

Error correction plays an important role in both communication and storage systems. Optical communication-systems typically operate at very high speeds and may involve a limited degree of parallelism via wavelength and/or polarization multiplexing. Space or time division multiplexing may significantly increase the parallelism of optical communication channels for use within computer interconnect environments. To ensure efficient utilization of channel bandwidth and avoid unwanted data bottlenecks, it is necessary to implement high speed error decoders within such systems.

Optical memories offer high storage capacities, and with volume storage techniques, can achieve very high aggregate data rates via parallel access. Optical memories however, like other storage media are prone to errors owing to media defects, noise and faulty read/write systems. Conventional error correction techniques involve decoding in a time-sequential (i.e., serial) fashion; however, the highly parallel nature of the data retrieved from page access optical memory, for example, requires an alternate solution, since such a serial decoding scheme can produce a severe bottleneck in the system.

SUMMARY OF THE INVENTION

Consistent with the present invention, a system for transmitting or storing user information data is provided, which comprises an encoder configured to convert the user information data into space or time domain encoded data in accordance with a Reed-Solomon code. The encoder further supplies the encoded data to a medium for either transmission or storage. A decoder Is also provided which is coupled to the medium for decoding the encoded data in the spectral or frequency domain and in a parallel format to thereby obtain corrected user information data.

BRIEF DESCRIPTION OF THE DRAWINGS

Advantages of the present invention will be apparent from the following detailed description of the presently preferred embodiments thereof, which description should be considered in conjunction with the accompanying drawings in which.

DETAILED DESCRIPTION

In accordance with the error correcting scheme of the present invention, information data is encoded and decoded in parallel and in the spectral or frequency domain based on a Reed-Solomon (RS) code. As a result, when compared with space or time domain decoding, the spectral decoding scheme of the present invention shifts some of the computationally intensive modules into the encoder thus reducing decoder complexity. Thus, integrated circuit implementations of the error correcting scheme of the present invention are faster, have reduced power dissipation and occupy less chip area than conventional serial encoders and decoders.

Figure 1:
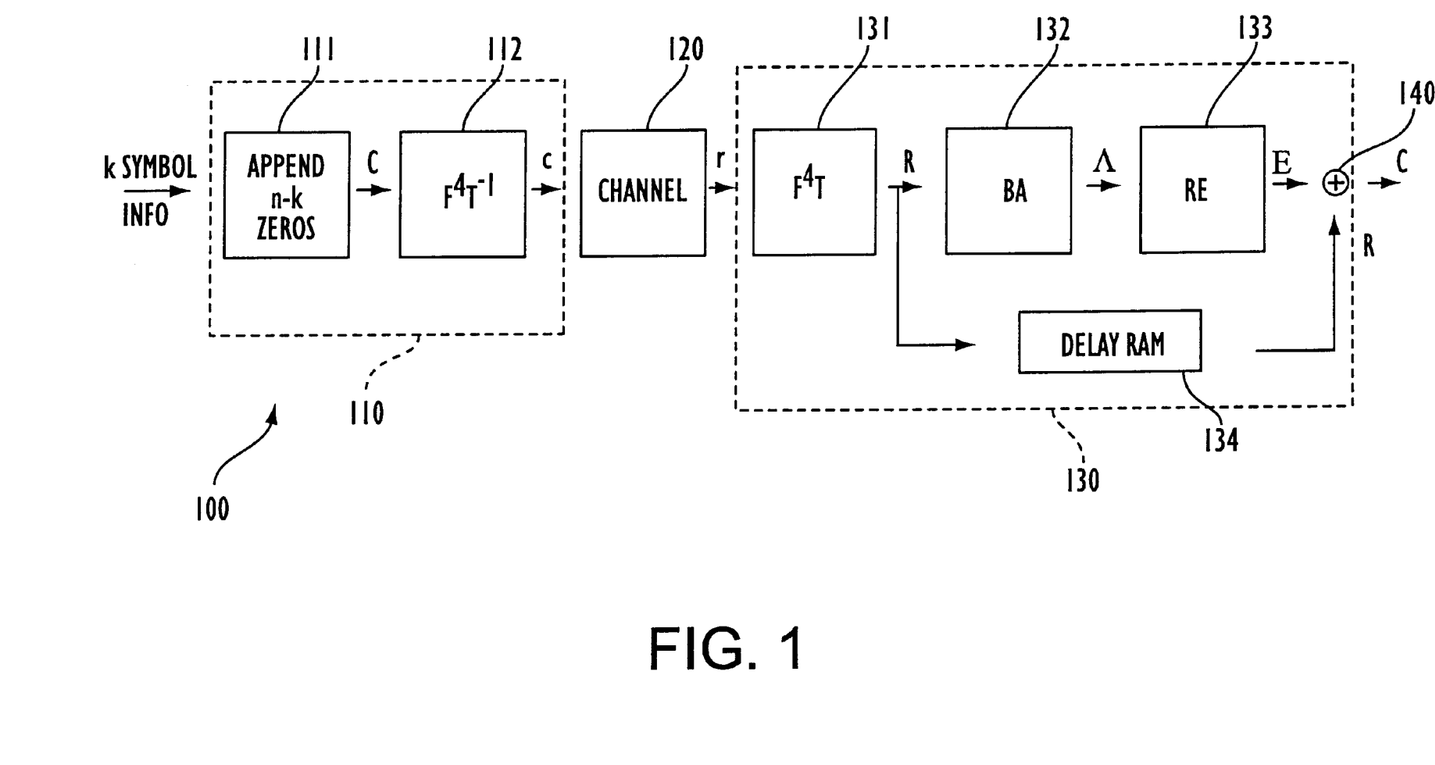
FIG. 1 illustrates a data encoding/decoding system in accordance with the present invention.

Turning to the drawings in which like reference characters indicate the same or similar elements in each of the several views, FIG. 1 illustrates a functional block diagram of an encoding/decoding system 100 in accordance with the present invention. Encoding/decoding system 100 includes an encoder 110 which encodes received user information data in accordance with an RS code, and supplies the encoded data to a medium or channel 120 (e.g., an optical storage medium or transmission line) to a decoder 130. The encoded data, usually in the form of bits of electronic data, can be supplied to an electrical-to-optical conversion element (not shown) prior to transmission through channel 120. Upon receipt of the encoded binary data, decoder 130 including optical to electrical conversion elements (not shown) decodes the encoded binary data and outputs the information data.

As further shown in FIG. 1, user information data is typically segmented into symbols, each symbol being m bits in length, where m is an integer. Typically, k symbols (k being another integer) of user information data are input to encoder 110. The k symbols of user information data is treated as spectral domain data and a plurality of error correcting symbols, each typically having a value of zero, are attached to the k symbols of information data by an appending circuit 111. The resulting group of symbols is referred to as a codeword vector C of length n, n being an integer greater than k, such that there are n–k zero symbols appended to the k symbols of information data. Circuit 112 next acts on the symbols of codeword C in parallel to generate an inverse finite field Fourier transform ($F^4T^{-1}$) that converts spectral domain codeword C into a space domain vector c, which is then supplied to medium or channel 120.

Vector r, which is the signal received from channel 120, is next detected at receiver 130. Any errors occurring during transmission can be represented by a vector e, such that r=c+e, where c is the inverse $F^4T$ of codeword vector C. Circuit 131 constitutes spectral domain conversion means, which in this example, typically performs an $F^4T$ on the received vector r to obtain spectral domain vector R, which is used in the decoding process, discussed in greater detail below. Other circuits that perform space to spectral domain conversion are also considered within the scope of the present invention. Since the $F^4T$ is linear, transformed vector R equals the sum of codeword vector C and the $F^4T$ of e, i.e., the error vector E comprising a plurality of error symbols. Since the encoding was performed in the spectral domain, the last 2t (i.e., 2t=n−k) symbols of the code word C are zeros. Accordingly, the last 2t symbols of the error vector E equal the last 2t symbols of the vector R. That is, $$E_j = R_j \text{ for } j=k, k+1, \ldots, n-1,$$

where Ej is the jth symbol of the spectral error vector E. The last 2t symbols or syndromes of the error vector E are thus obtained directly from the $F^4T$ of the received vector r, and supplied to parallel Berlekamp Algorithm (BA) circuit 132, which outputs error coefficients of an error locator polynomial $\Lambda(x)$. As discussed in greater detail below, the coefficients of the error locator polynomial are used to calculate each component of the error vector E. Once E is known, it is then added to R to obtain the codeword C and the original k symbols of user information data.

The operation of parallel BA circuit 132 will now be described in greater detail. Given that $v \leq t$ symbol errors occur, the error locator polynomial is defined as:

$$\Lambda(x) = \prod_{l=1}^{v} (1 - x\alpha^{j_l}), \quad [1]$$

As is generally understood, $\alpha$ in the above equation is the nth root of unity over a particular mathematical set known as a finite Galois Field $GF(q^m)$, and $i_1$ is the location of the ith error in the error vector. The error locator polynomial is defined such that if the ith symbol of the error vector e is non-zero (i.e., an error has occurred at the ith symbol), then $\alpha^{-i}$ is a root of $\Lambda(x)$. The inverse $F^4T$ of $\Lambda(x)$ can be calculated to obtain the polynomial $\lambda(x)$, defined as:

$$\lambda(x) = F^4T^{-1}[\Lambda(x)] = 1 + \lambda_1 x + \lambda_2 x^2 + \cdots + \lambda_t x^t. \quad [2]$$

This polynomial is characterized whereby $\lambda_i e_i = 0$, for all i=1, 2, ..., t, and facilitates determination of the error vector E through a process referred to as recursive extension, to be discussed in greater detail below.

For a t symbol error correcting RS code, the error vector can have at most t symbol errors. This means that the error locator polynomial is at most a degree t polynomial. The BA which is used to compute the error locator polynomial, is defined by the following set of recursive equations with recursion index r:

$$\Delta_r = \sum_{j=0}^{n-1} \Lambda_j^{(r-1)} S_{r-j}, \quad [3]$$

$$L_r = \delta_r(r - L_{r-1}) + (1 - \delta_r)L_{r-1},$$

$$\begin{pmatrix} \Lambda^{(r)} \\ B^{(r)} \end{pmatrix} = \begin{pmatrix} 1 & -\Delta_r x \\ \Delta_r^{-1} \delta_r & (1 - \delta_r)x \end{pmatrix} \begin{pmatrix} \Lambda^{(r-1)} \\ B^{(r-1)}, \end{pmatrix}$$

where $S_1, S_2, \ldots, S_{2t}$ are the syndrome symbols, $\Lambda(x)$ the error locator polynomial and $B(x)$ an intermediate polynomial. The initial conditions are $\Lambda^{(0)}(x)=1$, $B^{(0)}(x)=1$ and $L_0=0$. This set of recursive equations are executed for 2t iterations and for each iteration, $\delta_r=1$ if both $\Delta_r \neq 0$ and $2L_{r-1} \leq r-1$ else $\delta_r=0$.

There are 2t stages of BA circuit 132. The initial value of the error locator polynomial is a constant equal to one, for example, and the degree of this polynomial typically increases with each stage of the algorithm. Hence the architectural complexity of the algorithm increases from Stage 1 until Stage t and from then on remains the same until the last stage. Alternatively, in a serial decoding implementation, a single Berlekamp stage is used repeatedly 2t times to obtain the error locator polynomial. In the parallel mode, this time multiplexing is unfolded to obtain a pipeline processing architecture.

Figure 2:
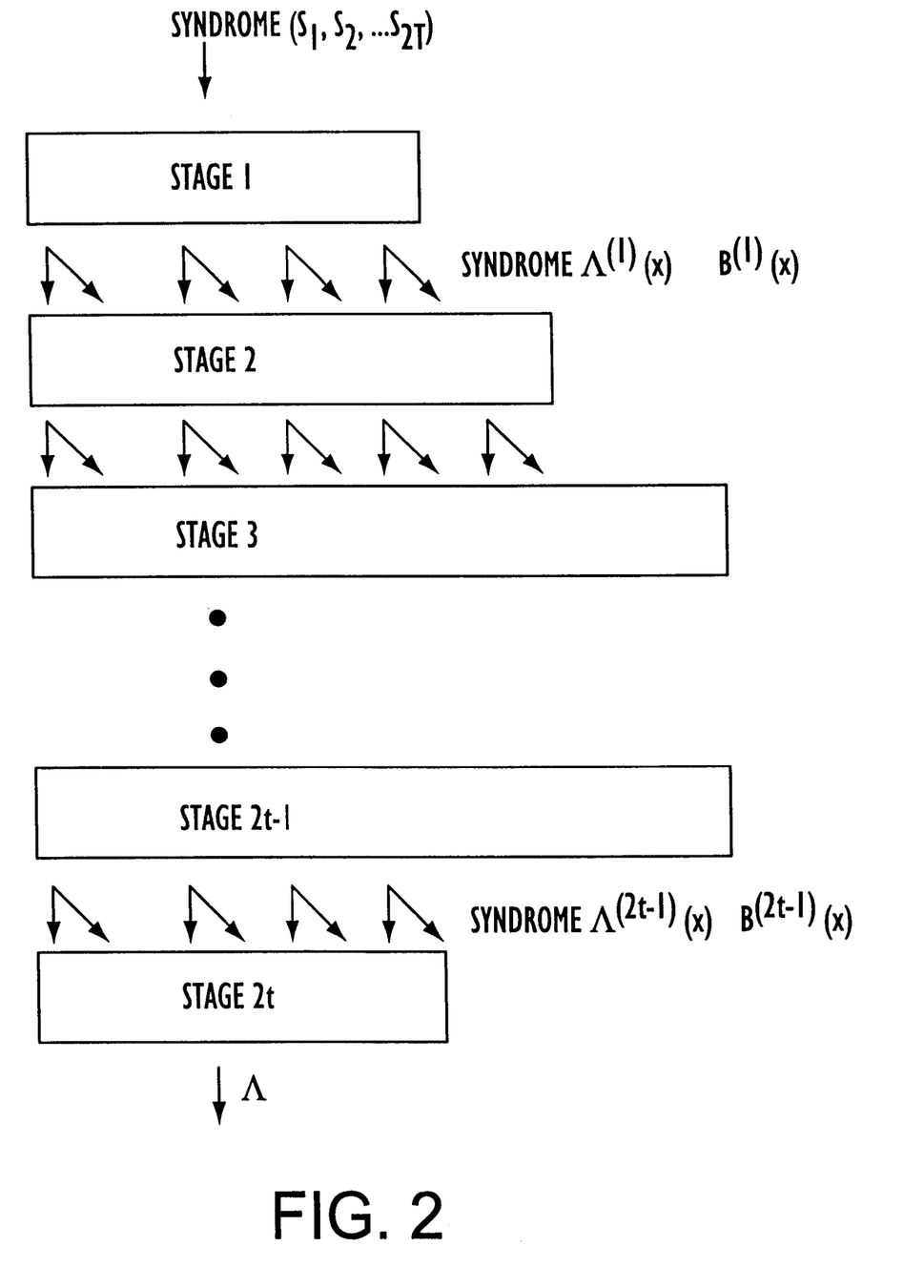
FIG. 2 illustrates a block diagram of a parallel Berlekamp Algorithm circuit in accordance with the present invention.

FIG. 2 illustrates the parallel pipeline architecture of BA circuit 132 in accordance with the present invention. As shown in FIG. 2, syndrome symbols $S_1, S_2, \ldots, S_{2t}$ are supplied in parallel to the input Stage 1 of BA circuit 132, which outputs the syndromes and polynomials $\Lambda^{(1)}(x)$ and $B^{(1)}(x)$ in parallel to Stage 2. The outputs of Stage 2 are supplied to Stage 3, and the outputs of each successive stage are supplied to the next stage of the BA circuit 132.

Since the degrees of the polynomials involved in the BA computation increase from Stage 1 to Stage t, the associated integrated circuit area also increases. After the $t^{th}$ stage, the degree of these polynomials remain constant and hence all the subsequent stages require the same area, except for the last stage, i.e., Stage 2t, whereby the polynomial $B(x)$ need not be computed. Accordingly, the integrated circuit area occupied by Stage 2t is nearly half the area of the second to the last stage, Stage 2t−1.

The parallel structure shown in FIG. 2 advantageously achieves a data pipeline architecture and localized connectivity. Due to the pipeline architecture, each stage of the BA processes a different code word at each clock cycle. For instance, if during the first clock cycle a syndrome is loaded into Stage 1, this stage performs its task and the results are loaded into the Stage 2 during the next clock cycle. In the meantime, a new syndrome is loaded into the Stage 1. Thus, during any single clock cycle, there are as many as 2t different code words being processed simultaneously. Due to the localized connectivity of this architecture, efficient VLSI area utilization, which is not wire dominated, can be realized. Further, although the operational speed of the circuit may be limited by gate delays, long metal wire capacitances do not significantly slow the speed of the circuit.

Returning to FIG. 1, coefficients $\Lambda$ of the error locator polynomial output from BA circuit 132 and selected syndrome symbols are used by Recursive Extension (RE) circuit 133 to calculate error vector E. As noted above, error vector E is added to vector R to obtain codeword vector C, and thus, the k symbols of information data. The calculation of error vector E will now be described in greater detail.

Error vector E can be obtained from the error locator polynomial using RE. In the space domain, vectors $\lambda$ and e satisfy $\lambda \cdot e = 0$. Accordingly, in the spectral domain the RE is defined by the convolution:

$$\sum_{j=0}^{t} \Lambda_j E_{i-j} = 0, \quad i = 0, 1, \ldots, n-1, \quad [4]$$

Equation 4 above takes into account that the maximum degree of the error locator polynomial is t, yielding $\Lambda_j=0$ for j>t. Since $\Lambda_0$ equal one, further simplification of this equation yields:

$$E_i = \sum_{j=1}^{t} \Lambda_j E_{i-j}, \quad i = 0, 1, \ldots, n-1, \quad [5]$$
$$= \Lambda_1 E_{i-1} + \Lambda_2 E_{i-2} + \cdots + \Lambda_t E_{i-t}.$$

Furthermore, since $C_j = R_j - E_j = 0$, for $j = k, k+1, \ldots, n-1$, therefore $E_{j=Rj}$, for $j = k, k+1, \ldots, n-1$. These known 2t symbols and the t coefficients of the error locator polynomial are used in the above equation to obtain the remaining k symbols of the error vector. As in the case of the BA, a serial implementation of this decoder would use a single stage of the RE with time multiplexing to obtain the error vector E. In the parallel implementation of the present invention, however, this time multiplexing scheme is unfolded to obtain a k stage parallel processing pipeline architecture. A more detailed description of RE circuit 133 will be described below with reference to FIG. 5. The architecture of the RE functional module also has a data pipeline architecture and localized connectivity and results in an efficient implementation of this functional module. Due to its pipeline structure, at each clock cycle there are as many as k different code words being processed by the k stages of the RE. In addition, all k stages of the RE typically have a similar construction, thus greatly simplifying the design process.

While the BA and RE circuits 132 and 133 constituting an error signal generating means, calculate the error vector E, the output of the $F^4T$ circuit 131 (vector R) is temporarily stored in a delay random access memory (RAM) 134. Upon completion of the error vector E calculation, RE circuit 133 supplies error vector E to a comparison means, which in this example comprises a summing or adder circuit for adding vectors E and R. The resulting sum, is the codeword vector C. Alternatively, if appropriate, a negated vector E can be subtracted from vector R to obtain codeword vector C. The zero symbols attached to vector C are then truncated, thereby leaving the k symbols of information data.

Figure 4:
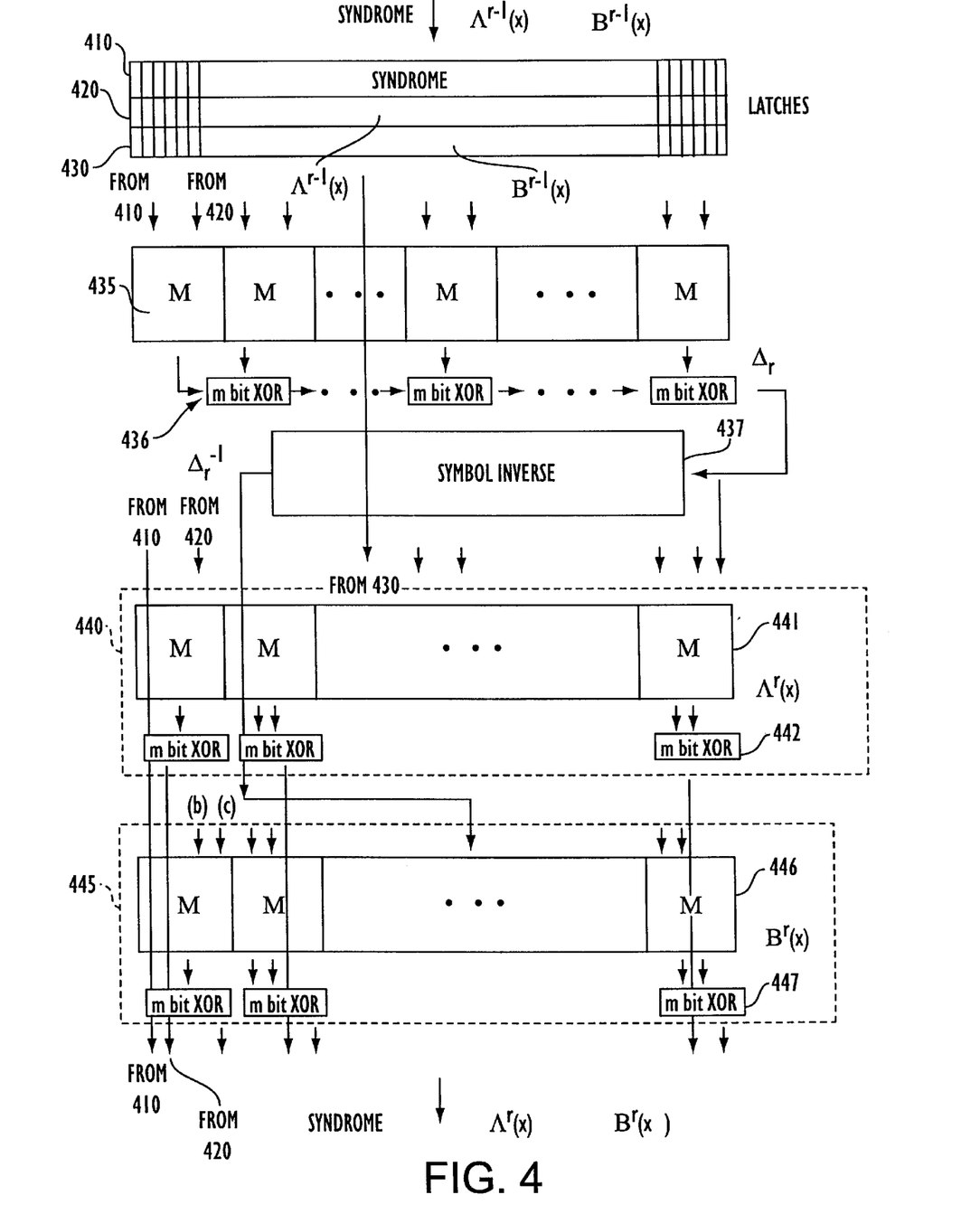
FIG. 4 is a detailed block diagram of the parallel Berlekamp Algorithm circuit.
Figure 5:
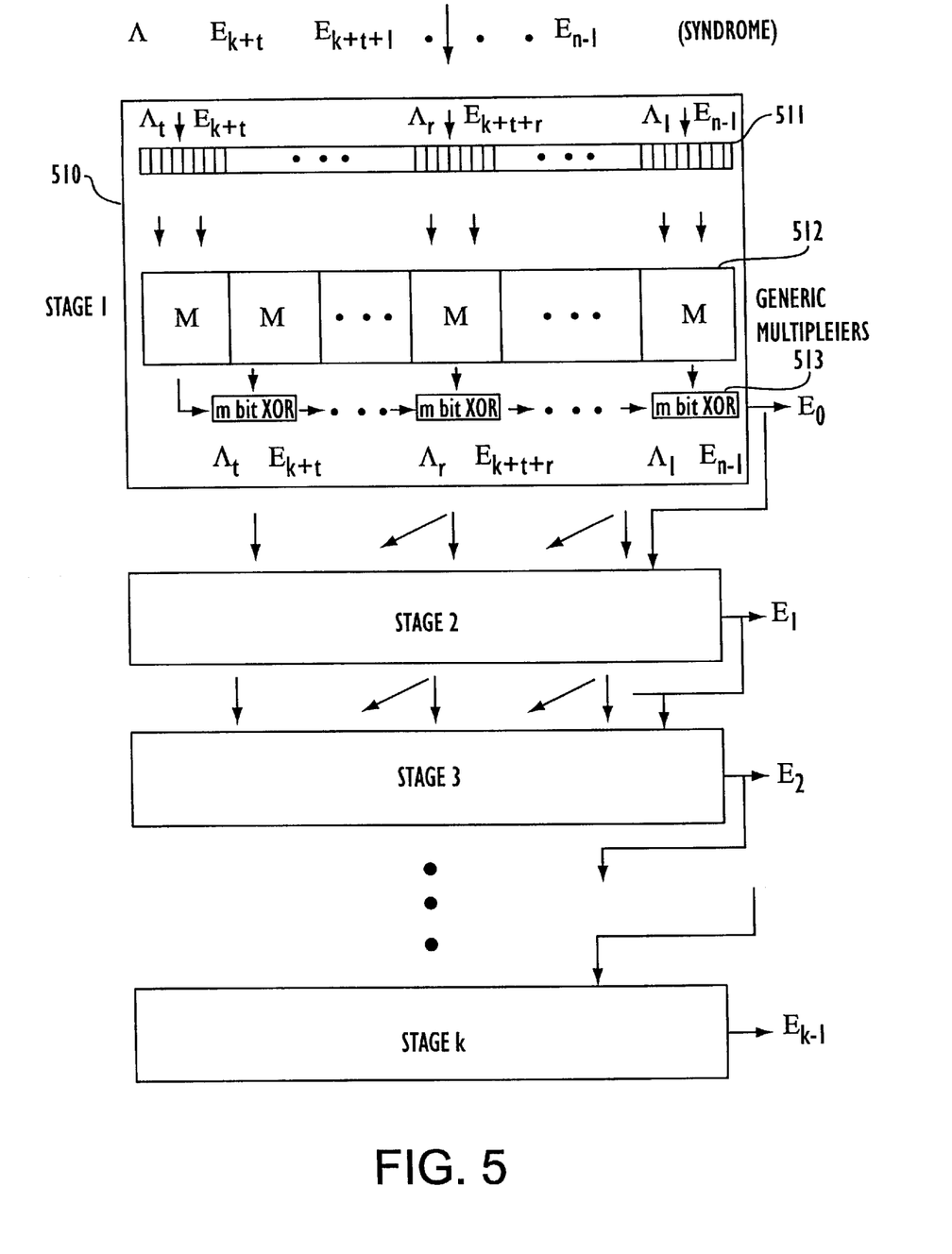
FIG. 5 is a detailed block diagram of a parallel Recursive Extension circuit in accordance with the present invention.

Decoder 134 including circuits 131, 132 and 133 will next be described in greater detail with reference to FIGS. 3–5.

Fourier transform circuit 131 will first be described. Fourier transform circuit 131 is realized using a parallel hardware realization of the Cooley-Tukey fast Fourier transform (FFT) algorithm. The Cooley-Tukey algorithm itself is described in M. A. Neifeld et al., "Parallel Error Correction For Optical Memories", Optical Memory and Neural Networks, vol. 3, no. 2, pp. 87–98, 1994, for example, and its implementation is described in greater detail below.

Finite field Fourier transforms ($F^3Ts$) are operable over a particular mathematical set referred to as a finite field and, therefore, differ from the conventional discrete Fourier transform (DFTs). Preferably, the DFT is modified for operation over the finite field and becomes:

$$V_j = \sum_{i=0}^{n-1} v_i \alpha^{ij}, \quad [6]$$

where $\alpha$ is the nth root of unity over the finite field, $v_i$ is the $i^{th}$ element of the space domain vector v and $V_j$ is the $j^{th}$ element of the Fourier transform vector V. Implementation of the $F^3T$ using the above formula directly, requires approximately $n^2$ multiplications and this exhaustive technique can impose severe constraints on computational resources, particularly when n is large. Several efficient FFT algorithms available for computing the conventional DFT can be modified and made applicable to the finite field domain yielding finite-field-fast-Fourier-transforms ($F^4Ts$).

The most popular $F^4T$ available involves the so-called butterfly technique; however, this approach is useful only for the case when n is a power of 2. In the case of RS codes, where $n = 2^{m-1}$, the butterfly technique is not typically employed. There are, however, several other algorithms available for the case when n is a composite. One such algorithm, the Cooley-Tukey algorithm is preferred.

The Cooley-Tukey $F^4T$ algorithm is applicable for cases when n is a composite number, i.e., a number which can be expressed as a product. More specifically, if n can be written as $n = n'n''$, introducing a new set of indices defined as $i = i' + n'i''$, for $i' = 0, \ldots, n'-1$; $i'' = 0 \ldots, n''-1$, $j = n''j' + j''$, for $j' = 0, \ldots, n'-1$; $j'' = 0 \ldots, n''-1$, [7]

the $F^4T$ equation can be rewritten as $$V_{n''j'+j''} = \sum_{i''=0}^{n''-1} \sum_{i'=0}^{n'-1} \alpha^{(i'+n'i'')(n''j'+j'')} v_{i'+n'i''}. \quad [8]$$

Expanding the products in the exponent and assuming $\alpha^{n'} = \gamma$ and $\alpha^{n''} = \delta$ dropping the term $\alpha^{n'n''i''j'}$, since $\alpha$ is of order n' n", gives $$V_{j'j''} = \sum_{i'=0}^{n'-1} \beta^{i'j'} \left[ \alpha^{i'j''} \sum_{i''=0}^{n''-1} \gamma^{i''j''} v_{i'i''} \right]. \quad [9]$$

Thus, the input and output data vectors have been mapped into two-dimensional arrays and an address re-shuffling has taken place. The $F^4T$ written in this new form requires at most $n(n'+n'')$ multiplications, as compared with $n^2$ multiplications in the conventional technique. The inner and outer sums in the Cooley-Tukey $F^4T$ formula each receive n numbers so that the inner sum is an n point $F^3T$ for each value of i' and the outer sum is an n point $F^3T$ for each value of i". If n' or n" is a composite number, then they in turn can be simplified by another application of the $F^3T$. In this way, if n has factors $\{n_i\}$, the $F^4T$ can be decomposed to a form requiring roughly $n \Sigma_i n_i$ multiplications.

Figure 3:
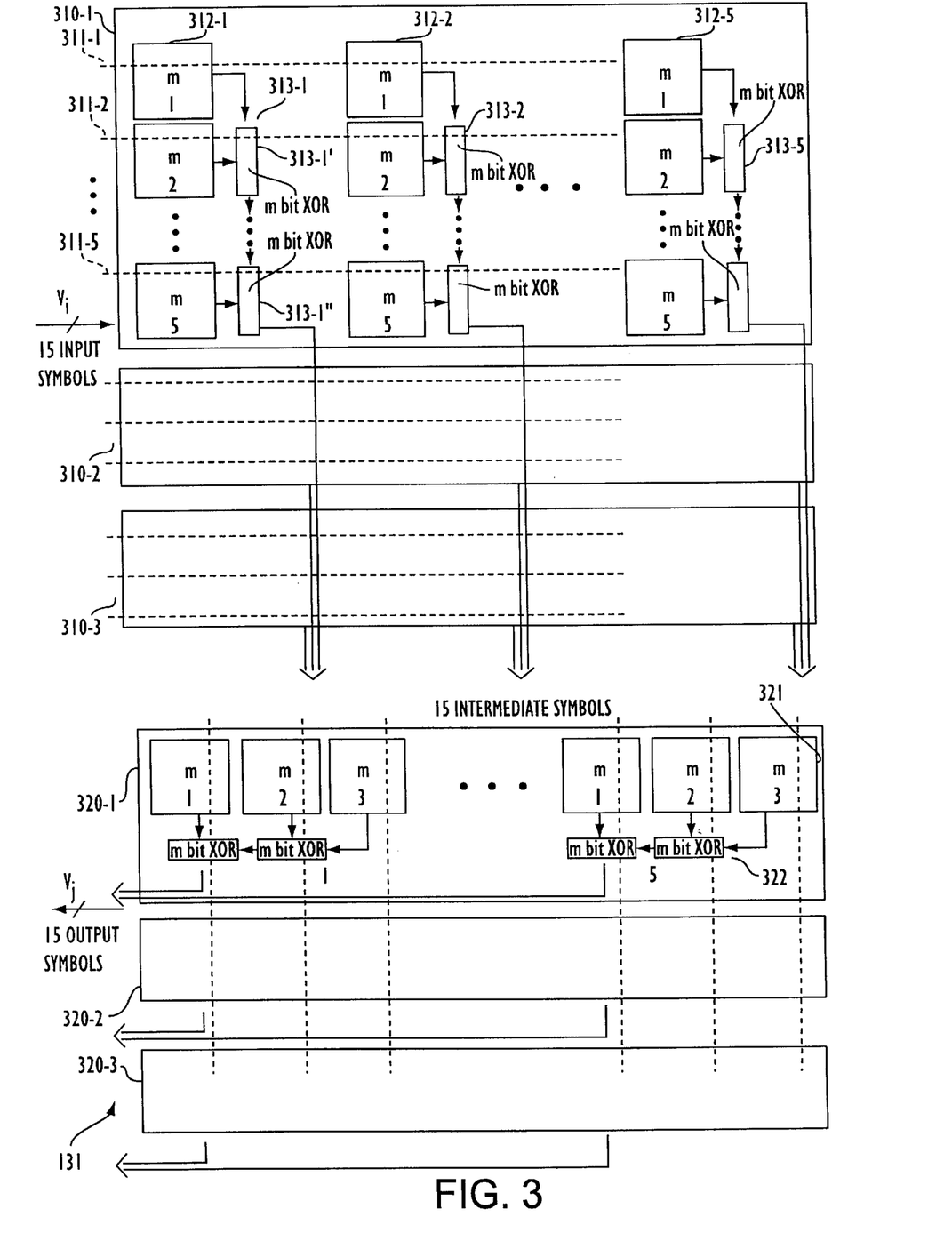
FIG. 3 is a block diagram of a parallel Fourier transform circuit.

An illustration of the parallel implementation of the Cooley-Tukey algorithm for the codeword of length $n = 15$ case is shown in FIG. 3. Upper circuit blocks 310-1, 310-2 and 310-3 in FIG. 3 receive 15 symbols in parallel. These 15 symbols constitute the input space domain vector $v_i$, i.e., the received vector r. A first group of five symbols is supplied in parallel to block 310-1, and second and third groups of five symbols each are similarly fed to blocks 310-2 and 310-3, respectively. It is understood that blocks 310-2 and 310-3 have a similar construction as block 310-1.

As further shown in FIG. 3, five input symbols are supplied on respective input lines 311-1 to 311-5 coupled to block 310-1. These input lines are coupled to columns of finite field multiplication stages 312-1 to 312-5. Each column includes five finite field multiplication stages (including multipliers m1 to m5, which carry out the multiplications required by equation 9 above and corresponding m bit XOR gates, which facilitate additions required by equation 9), and each multiplier receives a corresponding input symbol. Further, each multiplier multiplies an input symbol with a known or fixed symbol, and the outputs of two adjacent multipliers within each column are exclusive-ORed by m bit XOR gates 313, which are also arranged in columns 313-1 to 313-5 adjacent each of multiplier columns 312-1, 312-2 and 312-3, respectively. The output of each of the XOR gates within a given column is supplied to a successive XOR gates within the column, which in turn exclusive-ORs the previous output with the product generated by an adjacent multiplier. Thus, for example, the outputs of multiplier m1 and m2 in column 312-1 are supplied to m bit XOR gate 313-1'. The output of XOR gate 313-1' is supplied to a successive mn bit XOR gate, which exclusive-ORs the output of gate 313-1' with the product generated by multiplier m3 (not shown) in column 312-1. The outputs of the XOR gates in each of columns 313-1 to 313-5 are output from one XOR gate to the next in a cascaded manner, and the last m bit XOR gate in each of columns 313-1 to 313-5 outputs a corresponding one of the 15 intermediate symbols supplied to lower blocks 320-1 to 320-3. Accordingly, for example, m bit XOR gate 313-1" outputs one of the 15 intermediate symbols. Preferably, the 15 intermediate symbols are generated in a single clock cycle.

Moreover, blocks 310-2 to 310-3 respectively output groups of five intermediate symbols each. Thus, the upper blocks constitute a 3 point $F^3T$, and since each of blocks 310-1 to 310-3 output five intermediate symbols each, the total number of intermediate symbols is fifteen.

Each of lower blocks 320-1 to 320-3 receives the 15 intermediate symbols in parallel, and each output three groups of five symbols each. The lower blocks thus constitute a five point $F^3T$, and together the upper and lower blocks output symbols $V_j$ (i.e., spectral domain vector R), preferably in a second clock cycle. Lower blocks 320-1 to 320-3 have a similar construction and generate vector V in a similar fashion as the upper blocks output the intermediate symbols. However, instead of the multipliers being arranged in columns, the multiplier in the lower blocks are arranged in rows, e.g. row 321 of lower block 320-1. As further shown in FIG. 3, the outputs of groups of three multipliers, instead of five in the upper blocks, are supplied to m bit XOR gates 322.

The upper and lower blocks constitute an $F^4T$ and operate to multiply an unknown finite field symbol with a known finite field symbol. As a result, less integrated circuit area is required than a generic multiplier which operates on two unknown symbols.

Upon completion of the $F^4T$, the last 2t symbols of the resulting vector are passed to the first stage of the BA circuit 132. FIG. 4 shows a detailed block diagram of an arbitrary stage of BA circuit 132 shown in FIG. 2.

As noted above, the initial values of parameters $\Lambda^0(x)$ and $B^0(x)$ are set to a constant, 1, and loaded into latches 420 and 430, respectively. In addition, the syndrome symbols are loaded into latches 410 at the top of the structure shown in FIG. 4. Latches 410, 420 and 430 output the syndrome symbols, $\Lambda^0(x)$ and $B^0(x)$ to finite field multiplication stage 435, which includes generic multipliers M.

M operate simultaneously and in parallel, and the outputs of each of the multipliers are supplied to cascaded m bit XOR gates 436 to thereby compute intermediate symbol $\Delta_1$ (recursive index r equaling 1 in Stage 1 of BA circuit 132 and being incremented for each successive stage) using equation 3 above. Typically, due to the parallel construction of BA circuit 132, symbols $\Delta_r$ and $\Delta_r^{-1}$ are obtained and $\Lambda^r(x)$ and $B^r(x)$ are output in a single clock cycle.

Symbol $\Delta_1$, is next supplied to Symbol Inverse block 437, which outputs symbol $\Delta_1^{-1}$, the finite field inverse of $\Delta_1$, using a look-up table (not shown). The next two blocks 440 and 445 then compute the coefficients of the $\Lambda^1(x)$ and $B^1(x)$ polynomials based on $\Delta_1$, $\Delta_1^{-1}$, $\Lambda^0(x)$ and $B^0(x)$. Block 440 includes an array 441 of finite field multiplication stages M, which operate simultaneously and in parallel on parameters $\Delta_1$, $\Lambda^0(x)$ and $B^0(x)$ to generate outputs which feed corresponding m bit XOR gates 442. The outputs of m bit XOR gates 442 constitute the coefficients of polynomial $\Lambda^1(x)$. Similarly, array 446 of finite field multiplication stages M operate simultaneously and in parallel on $\Delta_1^{-1}$, $\Lambda^0(x)$ and $B^0(x)$ to output the coefficients of polynomial $B^1(x)$. The syndrome symbols stored in latches 410, and the coefficients of polynomials $\Lambda^1(x)$ and $B^1(x)$ are passed to Stage 2 of FIG. 2. Each stage of BA circuit 132 similarly outputs polynomial coefficients and syndrome symbols to successive stages, such that at the end of 2t stages, the desired error locator polynomial $\Lambda(x)$ is obtained.

Once the coefficients of the error locator polynomial are obtained, the next stage in the decoding process involves computing the error vector using recursive extension (RE). RE circuit 133 will now be described with reference to FIG. 5.

Each of Stages 1 through k of RE circuit 133 outputs a respective symbol of error vector E. For example, Stage 1 (block 510) outputs $E_0$, while stages 2, 3, . . . k output symbols $E_1$, $E_2$, $E_{k-1}$, respectively. Block 510 illustrates Stage 1 in greater detail. It is understood that Stages 2–k have a similar construction as Stage 1.

Block 510 outputs symbol $E_0$ based on the last t syndrome symbols of vector R represented by $E_{k+t}$, $E_{k+t+1}$ . . . $E_{n-1}$ in FIG. 5, and the last t coefficients of the error locator polynomial ($\Lambda_t$ . . . $\Lambda_r$ . . . $\Lambda_1$) in accordance with equation 5 above. As further shown in FIG. 5, the syndrome symbols and error locator polynomial coefficients are supplied to array 512 of generic multipliers M via latches 511. The outputs of multipliers M are next exclusive ORed in a cascaded manner by m bit XOR gates 513. Following this first stage, output $E_0$, the coefficients of the error locator polynomial, and the t−1 necessary symbols of the syndrome are provided as inputs to the next RE stage to compute $E_1$. This procedure is carried out for k stages at the end of which, all the symbols of the error vector are obtained. Comparing the error vector E, by either subtraction or addition, with vector R yields codeword C. As noted above, the original k information symbols are thus readily obtained by truncating the n-k zero symbols appended at the end of the codeword.

An example of the operation of decoder 130 will be presented below.

Assume the spectral domain codeword C for a (15,9) RS code, including the appended 0's is:

$$C=(\alpha^9, \alpha^1, \alpha^0, \alpha^5, \alpha^{11}, \alpha^9, \alpha^{13}, \alpha^0, \alpha^8, 0, 0, 0, 0, 0, 0),$$

where $\alpha$ is the $15^{th}$ root of unit over a mathematical set known as a finite field, which is obtained using the generator polynomial $x^4=x+1$. Performing the inverse $F^4T$ yields $$c=(\alpha^1, \alpha^8, \alpha^{11}, \alpha^2, \alpha^2, \alpha^5, \alpha^9, \alpha^5, \alpha^6, \alpha^8, \alpha^8, \alpha^9, \alpha^{14}, \alpha^7, \alpha^{13}),$$

which is the output from $F^4T^{-1}$ circuit 112 shown in FIG. 1.

The vector c is then transmitted over channel 120, as discussed above. Assuming the occurrence of a three symbol error in the form $$e=(0, 0, 0, 0, 0, 0, \alpha^{14}, \alpha^7, 0, 0, 0, 0, 0, \alpha^0, 0),$$

with the corresponding $F^4T$ error vector E of the form $$E=(\alpha^4, \alpha^1, \alpha^6, \alpha^4, \alpha^3, 0, \alpha^{13}, \alpha^1, \alpha^8, \alpha^{13}, \alpha^9, \alpha^{14}, 0, \alpha^1, 0),$$

results in the vector r received at receiver 130

$$r=(\alpha^1, \alpha^8, \alpha^{11}, \alpha^2, \alpha^2, \alpha^5, \alpha^4, \alpha^{13}, \alpha^6, \alpha^8, \alpha^9, \alpha^{14}, \alpha^9, \alpha^{13}),$$

whose $F^4T$, i.e., the output of circuit 131, yields $$R=(\alpha^{14}, 0, \alpha^{13}, \alpha^8, \alpha^5, \alpha^9, 0, \alpha^4, 0, \alpha^{13}, \alpha^9, \alpha^{14}, 0, \alpha^1, 0),$$

The last 2t=6 symbols comprise the symbol symbols $$S_1=\alpha^{13}, S_2=\alpha^9, S_3=\alpha^{14}, S_4=0, S_5=\alpha^1, S_6 0.$$

These six syndrome symbols are provided as inputs to Stage 1 of BA circuit 133. The various outputs from Stage 1 are as follows:

$$\Lambda(x)=\alpha^{13}x+1;$$

$$B(x)=\alpha^2;$$

and $$L_1=1.$$

The outputs after Stage 2 of BA circuit 132 are:

$$\Lambda(x)=\alpha^{11}x+1;$$

$$B(x)=\alpha^2 x;$$

and $$L_2=1.$$

The outputs after the third stage of BA circuit 132 are:

$$\Lambda(x)=\alpha^{14}x^2+\alpha^{11}x+1;$$

$$B(x)=\alpha^{14}x+\alpha^3;$$

and $$L_3=2.$$

The outputs of the fourth stage of BA circuit 132 are:

$$\Lambda(x)=\alpha^3 x^2+\alpha^{13}x+1;$$

$$B(x)=\alpha^{14}x^2+\alpha^3 x;$$

and $$L_4=2.$$

The outputs of the fifth stage of BA circuit 132 are:

$$\Lambda(x)=\alpha^4 x^3+\alpha^{13}x^2+\alpha^{13}x+1;$$

$$B(x)=\alpha^{13}x^2+\alpha^8 x+\alpha^{10};$$

and $$L_5=3.$$

The outputs after $2t^{th}$ (in this case sixth) stage are:

$$\Lambda(x)=\alpha^{11}x^3+\alpha^3 x^2+\alpha^9 x+1;$$

$$B(x)=\alpha^{13}x^3+\alpha^8 x^2+\alpha^{10}x;$$

and $$L_6=3.$$

The desired error locator polynomial, is therefore;

$$\Lambda(x)=\alpha^{11}x^3+\alpha^3 x^2+\alpha^9 x+1.$$

As noted above, the coefficients of the error locator polynomial are provided as inputs to RE circuit 133 along with t symbols of the error vector E. Accordingly, in the present example, the following parameters are input to RE circuit 133:

$$\Lambda_3=\alpha^{11}; \Lambda_2=\alpha^3; \Lambda_1=0; S_4=E_{12}=0; S_5=E_{13}=\alpha^1; \text{ and } S_6=E_{14}=0.$$

The output of the first stage of RE circuit 133 is given by $$E_0=\Lambda_1 E_{14}+\Lambda_2+E_{13}+\Lambda_3 E_{12}.$$

Substituting the appropriate values in the above equation gives $$E_0=\alpha^4.$$

Similarly, subsequent stages of RE circuit 133 give the other symbols of the error vector E in accordance with equation 5 above, namely $$E_1=\alpha^1, E_2=\alpha^6, E_3=\alpha^4, E_4=\alpha^3, E_5=0, E_6=\alpha^{13}, E_7=\alpha^1, E_8=\alpha^8.$$

The error vector E thus obtained is:

$$E=(\alpha^4, \alpha^1, \alpha^6, \alpha^4, \alpha^3, 0, \alpha^{13}, \alpha^1, \alpha^8, \alpha^{13}, \alpha^9, \alpha^{14}, 0, \alpha^1, 0).$$

Subtracting this error vector from the vector R output from $F^4T$ circuit 131 yields the codeword C:

$$C=(\alpha^9, \alpha^1, \alpha^0, \alpha^5, \alpha^{11}, \alpha^9, \alpha^{13}, \alpha^0, \alpha^8, 0, 0, 0, 0, 0, 0),$$

Based on the above description, the various computational units of an example of the present invention including a (15,9) Reed-Solomon spectral decoder were designed and laid out using a conventional VLSI layout tool. The decoder was fabricated in a 6 mm×4 mm MOSIS SMALL chip using a 2 $\mu$m CMOS process. From the layout of the (15,9) spectral decoder, scaling laws for VLSI area, electrical power dissipation and information rate were derived for codes of different block sizes and error correction capability. These scaling laws were expressed in terms of the code size (n), symbol size (m), error correction capability (t) and the process size ($\lambda$). A summary of these scaling laws is presented below and comparisons are drawn with serial decoder designs.

Figure 6A:
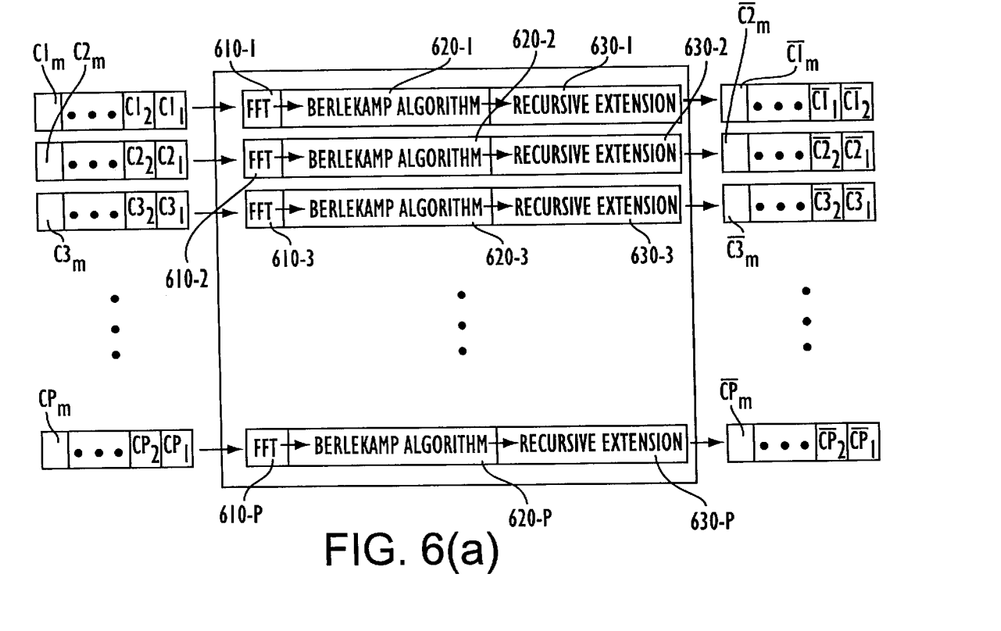
FIGS. 6(a) and 6(b) are block diagrams illustrating a serial decoder and a parallel decoder in accordance with the present invention, respectively.

In a serial implementation, one symbol of the received vector is provided as input to the decoder during each clock cycle. This can act as a bottleneck in high data rate applications. One way to increase decoding speed within the serial paradigm is to utilize an array of serial decoders operating in parallel. In particular, as shown in FIG. 6(*a*), codewords C1, C2, . . . CP are supplied serially in a symbol-wise fashion to serial $F^4T$, BA and RE blocks 610-1 . . . 610-P, 620-1 . . . 620-P, and 630-1 . . . 630-P, respectively. Each decoder, e.g., blocks 610-1, 620-1 and 630-1, will then operate independently on separate code words. If there are P serial decoders in such an array, the aggregate decoding data rate achieved is P times that of a single serial decoder.

Figure 6B:
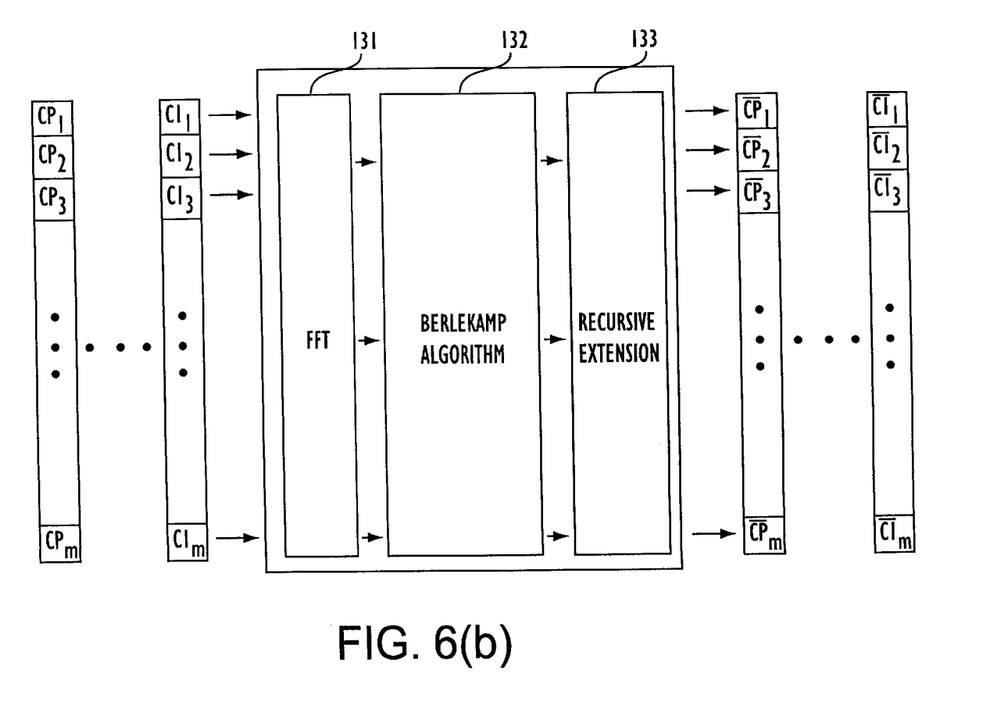

In accordance with the present invention, however, time domain decoding is unfolded to produce a parallel pipeline decoder, as shown in FIG. 6(*b*). This decoder receives an entire code word at each clock cycle. That is blocks 131, 132 and 133 operate on all the received symbols corresponding to an entire codeword in parallel and at the same time. Such a decoding paradigm provides the decoder simultaneous access to all code word symbols, and therefore can yield significant savings in implementational resources as compared with the array of serial decoders shown in FIG. 6(*a*).

Figure 7:
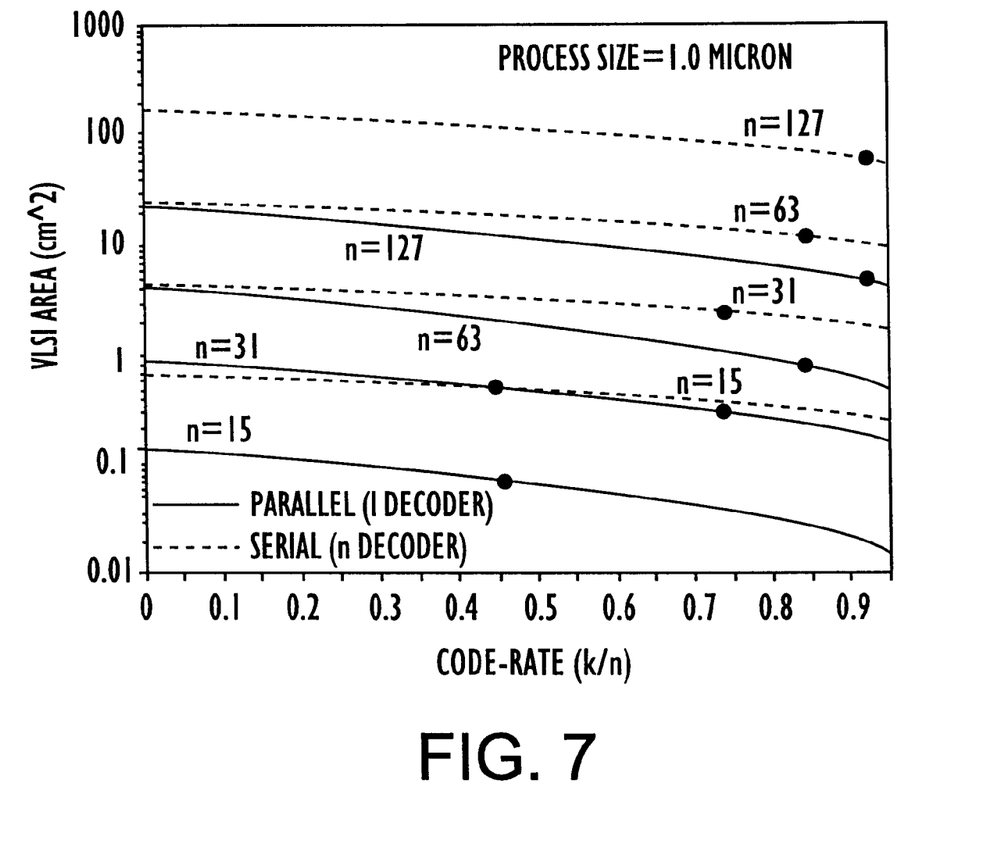
FIG. 7 illustrates plots of very large scale integrated circuit area as a function of code-rate for both serial decoders and decoders in accordance with the present invention.

FIG. 7 illustrates very large scale integrated circuit (VLSI) area as a function of code rate for a serial decoder and a parallel decoder in accordance with the present invention. As can be seen from this figure, the parallel decoder in accordance with the present invention requires less VLSI area than an array of serial decoders for codes of all block sizes considered. The performance of the parallel decoder in accordance with the present invention is significantly improved at relatively high code rates. Many practical code-rates are in the range of 0.75 to 0.80, and in this range, parallel decoders in accordance with the present invention offer a much better implementation efficiency than the array of serial decoders, as represented by more than an order of magnitude improvement in area shown in FIG. 7.

In a typical application environment it is common to be provided with a specification of raw input bit error rate (BER) and desired output BER. Such a system specification defines the code rate required for each RS block size n. In generating the plot shown in FIG. 7, an input BER of $10^{-4}$ and a required output BER of $10^{-12}$ was assumed. Given these BER requirements, the required code rate was computed for each RR block size considered and these operating points are represented by the solid circles in FIG. 7. Further, it should be noted that within a typical chip area of 1 cm$^2$, a parallel decoder for decoding codewords having lengths of n=63 can be easily realized using a 1 $\mu$m CMOS process.

Figure 8:
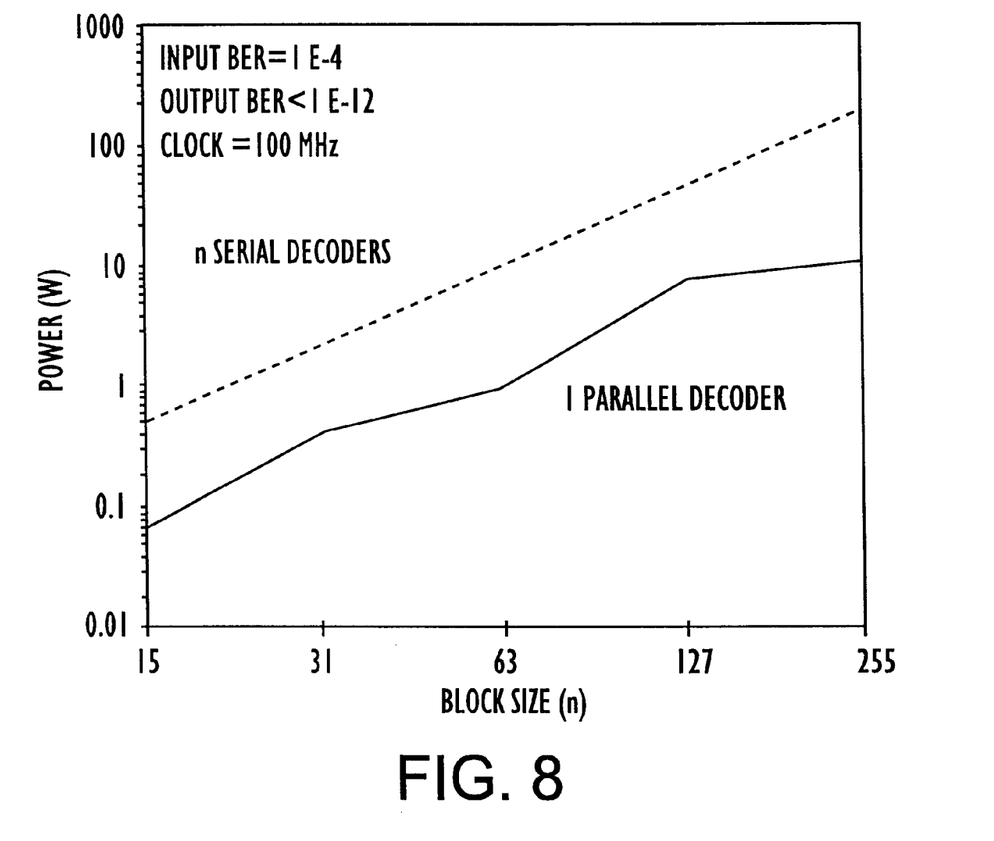
FIG. 8 illustrates plots of power dissipation as a function of block size (n) for serial decoders and parallel decoders in accordance with the present invention.
Figure 9:
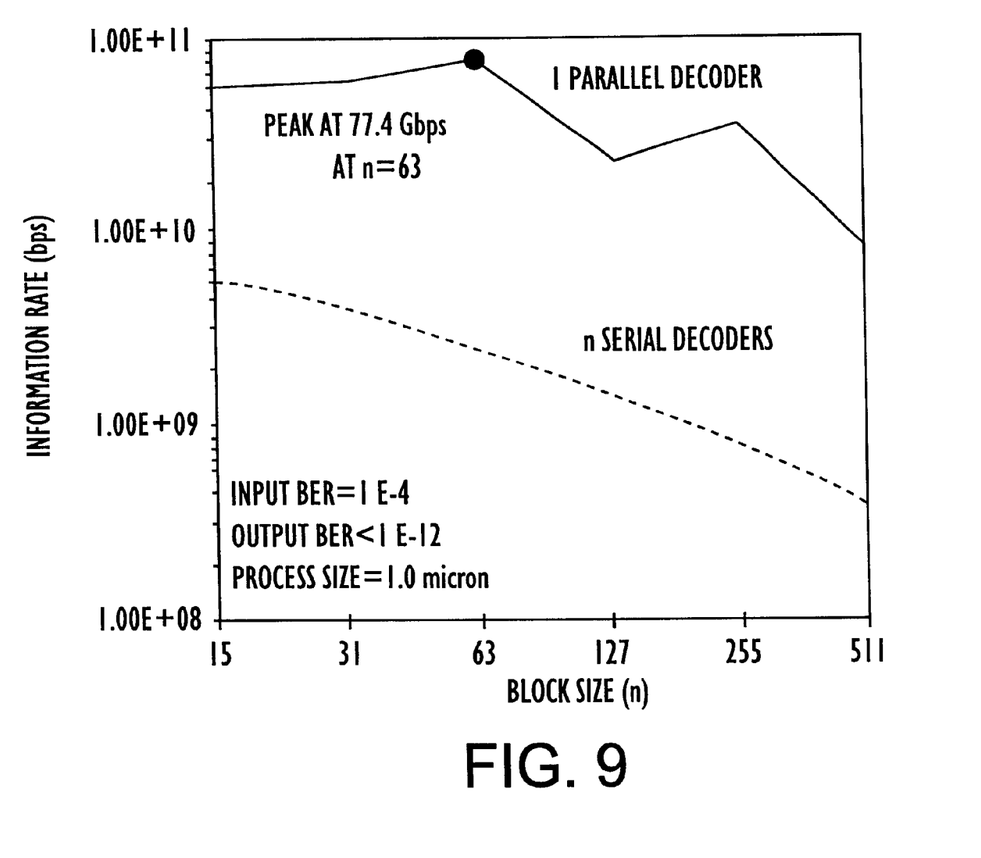
FIG. 9 illustrates plots of information rate as a function of block size for serial decoders and parallel decoders in accordance with the present invention.

Additional advantages will become apparent in light of the description of FIGS. 8 and 9 below. In particular, comparisons between the serial decoders and parallel decoders in accordance with the present invention will be drawn as a function of block size assuming operation at the input/output BER goals indicated above.

Scaling laws were also derived for another important implementational characteristic: the power dissipation from a chip on which such a decoder has been fabricated. The power dissipation is directly linked to the number of transistors on the chip and the rate at which the chip is operated. If $P_c$ is the total electrical power dissipated from the chip, C the gate capacitance of a transistor, N the total number of transistors on the chip and f the clock rate, the total power dissipation can be written as $P_c=\frac{1}{2}CV^2(N/2)f$, where it has been assumed that at any given time, half of the transistors on the chip are active. A typical value of V is 5V, and a typical value of C for a 1 $\mu$m CMOS P-well process is $6.9\times10^{-15}$F. Current CMOS technology offers clock rates of 100 MHz, and hence both types of decoders were operated at 100 MHz. The corresponding total power dissipations were computed for a fixed input/output BER and are shown in FIG. 8. As can be seen from this figure, the array of serial decoders dissipates more power than the parallel decoder in accordance with the present invention. More importantly, for codes of block sizes up to 63, the total power dissipated by the parallel decoder is less than 1 W.

Another parameter which can be considered is the power density on the chip, since this correlates directly with system coolong requirements. This metric is obtained by dividing the total power (FIG. 8) by the total area (FIG. 7). It has been determined that serial decoders dissipate approximately 1 W/cm 2, whereas the parallel decoder in accordance with the present invention, owing to its reduced area requirements, can dissipate up to a maximum of 2 W/cm 2 depending on the block size chosen. Accordingly, although the power density of the parallel implementation is higher than that of the serial array, the power density levels associated with the present example of the invention are relatively low and are not expected to limit system performance.

Information rate is an additional performance metric to be considered. In the present example, the total chip area is assumed to be fixed at 1 cm$^2$, and the clock rate is assumed to be 100 MHz. Fixing the VLSI area in turn fixes the total number of decoders that can be realized in a chip and hence the parallelism is also fixed. The information rate can now be defined as Information rate=Parallelism×Clock×Code-rate×=mn×# of decoders×Clock×k/n. FIG. 9 illustrates a plot of information rate as a function of block size for the parallel decoder in accordance with the present invention and the array of serial decoders. Both decoders offer higher information rates as they operate at smaller block sizes. However, for the same input/output BER requirements, smaller block sizes require lower code rates. Accordingly, the overhead or the redundancy necessary to achieve the same BER performance increases for smaller block sizes. In the case of the parallel decoder in accordance with the present invention, there is a peak at a block size corresponding to a codeword length of n=63. The resulting maximum information rate which can be achieved is 77.4 Gbps. There is not much difference in the information rate when using codes of block sizes ranging from n=15 to n=63; however, operating at n=63 yields improved channel efficiency (i.e., higher code rate) and larger burst error correction capability.

Extensive SPICE simulations were carried out to test the different functional modules of the (15,9) spectral decoder. This design used the Cooley-Tukey F$^4$T, 6 stages of the Berlekamp algorithm and 9 stages of the RE. The total transistor count of the spectral decoder was 33,000. The chip was fabricated using a 2 $\mu$m CMOS process and SPICE simulation for this process resulted in a maximum clock of 41.1 MHz at an aggregate data rate of 2.46 Gbps.

Figure 10:
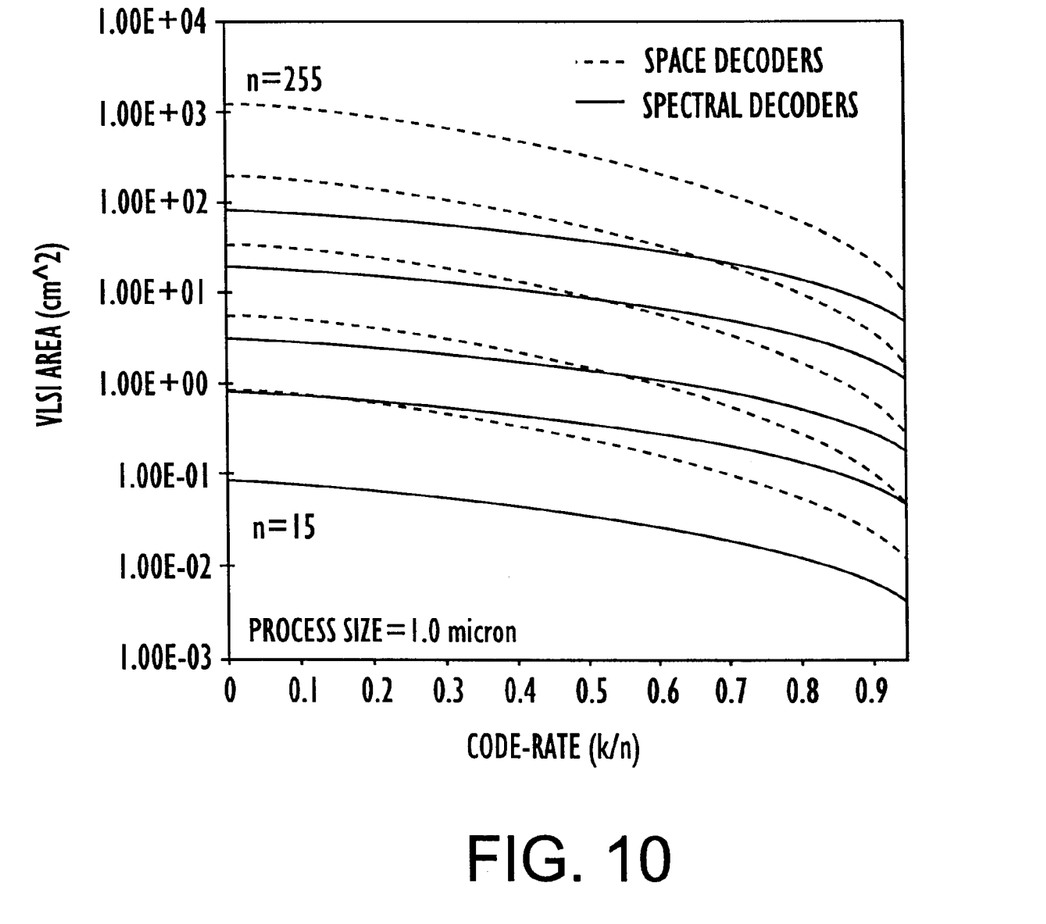
FIG. 10 illustrates plots of VLSI area for parallel space domain decoders and a decoders in accordance with the present invention.

Parallel decoding in the spectral domain will now be compared with conventional parallel decoding in the space domain, as described in Neifeld et al., supra. In the space domain parallel decoder, the Euclidean algorithm is used to determine the error locator polynomial, followed by a Chien search to complete the error correction. The syndrome, Euclidean algorithm and the Chien search functional modules have parallel pipeline processing and each of the functional modules are locally connected. As seen in FIG. 10, which compares the VLSI area associated with the space domain decoder and the decoder in accordance with the present invention, the spectral decoder in accordance with the present invention requires much less VLSI area than the parallel space decoder. It is noted, however, that since the analysis of the spectral decoder did not include the F$^4$T circuit, the syndrom area was not included in the space decoder to justify a fair comparison.

Moreover, the parallel spectral decoder in accordance with the present invention can process more bits in a given clock cycle than the conventional parallel space decoder. Further, the parallel spectral decoder has improved power dissipation, and has higher page rates and information rate throughputs than the conventional parallel space decoder.

The present invention can be used in applications involving a high degree of parallelism or very high aggregate data rates. For naturally parallel data, the decoder input format is well suited. In the case of high speed serial data, an input shift register can be used to facilitate high speed serial input and parallel decoding at a lower clock rate. This is an attractive alternative to serial decoding since the VLSI area necessary to implement the parallel spectral decoder is significantly lower than that required for an array of serial decoders offering identical performance. For a fixed VLSI area of 1 cm$^2$, a process size of 1 $\mu$m and a clock rate of 100 MHz, the n=63 parallel spectral RS code offers a maximum information rate of 77.4 Gbps.

While the foregoing invention has been described in terms of the embodiments discussed above, numerous variations are possible. For example, the present invention can be used to encode and decode other RS codes, such as RS product codes. Accordingly, modifications and changes such as those suggested above, but not limited thereto, are considered to be within the scope of the following claims.

What is claimed is:

1. An encoding/decoding system, comprising:
   a first integrated circuit including an encoder circuit symbols in response to second selected symbols of said spectral domain data and said plurality of error coefficients; and
   a comparison circuit comparing said error symbols with said spectral domain symbols to obtain said user information data as a result of said comparison.

2. An encoding/decoding system in accordance with claim 1, wherein said encoder circuit comprises:
   a space domain transforming circuit acting on said user information data in parallel to transform said user information data into space domain data to thereby generate said encoded data for transmission through said transmission medium.

3. An encoding/decoding system in accordance with claim 2, wherein said space domain transforming circuit comprises an inverse finite field fast Fourier transform circuit.

4. An encoding/decoding system in accordance with claim 2, wherein said user information data comprises a plurality of information symbols, said encoder further comprising:
   an appending circuit for attaching a plurality of error correcting symbols to k information symbols where k is an integer, each said error correcting symbols being substantially the same, said appending circuit outputting a codeword to said space domain transforming circuit, said codeword being n symbols in length, where n is an integer greater than k, said codeword including said k information symbols and n–k error correcting symbols.

5. An encoding/decoding system in accordance with claim 4, wherein each said plurality of error correcting symbols comprises zeros.

6. An encoding/decoding system in accordance with claim 1, wherein said spectral domain transforming circuit comprises a finite field fast Fourier transform circuit.

7. An encoding/decoding system in accordance with claim 1, wherein said comparison circuit comprises a summing circuit for adding said error bits to said spectral domain bits to thereby obtain said user information data.

8. An encoding/decoding system in accordance with claim 1, wherein said comparison circuit comprises a difference circuit for subtracting said error bits from said spectral domain bits to thereby obtain said user information data.

9. An encoding/decoding system in accordance with claim 1, further comprising a memory for storing said spectral domain symbols and supplying said spectral domain data to said comparison circuit.

10. An integrated circuit including a decoder circuit configured to correct errors present in Reed-Solomon encoded data and decoding said encoded data to output user information data, said decoder circuit comprising:
    a spectral domain transforming circuit transforming said Reed-Solomon encoded data into parallel spectral domain data, said parallel spectral domain data comprising a plurality of spectral domain symbols;
    an error signal generating circuit coupled to said inverse spectral domain transforming circuit, said error signal generating circuit outputting a plurality of error symbols in response to said parallel spectral domain symbols, said error signal generating circuit further comprising:
      a Berlekamp algorithm circuit acting on parallel first selected symbols of said spectral domain symbols to output a plurality of error coefficients in parallel, said Berlekamp algorithm circuit including at least t stages, where 2t=n–k, n being a number of symbols in a code word generated by said encoding circuit and k being a number of information symbols, each of said stages being spaced from one another and outputting a corresponding one of a term of an error locator polynomial; and
      a recursive extension circuit acting on said plurality of parallel error coefficients and second parallel selected symbols of said spectral domain data to output said error symbols; and
    a comparison circuit comparing said error symbols with said spectral domain symbols to obtain said user information data as a result of said comparison.

11. A decoder circuit in accordance with claim 10, wherein said spectral domain transforming circuit comprises a finite field fast Fourier transform circuit.

12. A decoder circuit in accordance with claim 10, wherein said comparison circuit comprises a summing circuit for adding said error symbols to said spectral domain symbols to thereby obtain said user information data.

13. A decoder in accordance with claim 10, wherein said comparison circuit comprises a difference circuit for subtracting said error bits from said spectral domain bits to thereby obtain said user information data.

14. A decoder circuit in accordance with claim 10, further comprising a memory for storing said spectral domain symbols and supplying said spectral domain symbols to said comparison circuit.

* * * * *